(12) United States Patent
Toda

(10) Patent No.: US 6,192,000 B1
(45) Date of Patent: Feb. 20, 2001

(54) SEMICONDUCTOR MEMORY DEVICE HAVING DECREASED LAYOUT AREA AND METHOD OF MANUFACTURING THE SAME

(75) Inventor: Haruki Toda, Yokohama (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/453,038

(22) Filed: Dec. 2, 1999

(30) Foreign Application Priority Data

Dec. 4, 1998 (JP) .................................................. 10-345624

(51) Int. Cl.⁷ ..................................................... G11C 8/00
(52) U.S. Cl. ................. 365/230.06; 365/231; 365/189.08
(58) Field of Search ........................ 365/230.06, 189.08, 365/231

(56) References Cited

U.S. PATENT DOCUMENTS

| | | | |
|---|---|---|---|
| 4,602,355 | * 7/1986 | Watanabe | 365/206 |
| 5,652,731 | * 7/1997 | Saeki | 365/230.06 |
| 5,719,818 | 2/1998 | Tovim et al. | 365/230.06 |
| 5,966,340 | * 10/1999 | Fujino et al. | 365/230.03 |

* cited by examiner

Primary Examiner—David Nelms
Assistant Examiner—Thong Le
(74) Attorney, Agent, or Firm—Banner & Witcoff, Ltd.

(57) ABSTRACT

A word line driving circuit drives four word lines in response to a signal supplied from a main row decoder through a main word line and in response to a word line driving voltage supplied from a sub-row decoder. When the word line driving circuit is not selected by the main word line, a first reset circuit allows each word line to be short-circuited. When the word line driving circuit is selected by the main word line, second to fifth reset circuits allow the non-selected word line to bear a ground potential by using a signal of the selected word line.

25 Claims, 10 Drawing Sheets

SEMICONDUCTOR MEMORY DEVICE HAVING DECREASED LAYOUT AREA AND METHOD OF MANUFACTURING THE SAME

BACKGROUND OF THE INVENTION

The present invention relates to a semiconductor memory device such as a dynamic random access memory (DRAM), particularly, to a driving circuit of a divisional driving system in which the word lines are divided into a plurality of groups for the driving.

This application is based on Japanese Patent Application No. 10-345624, filed Dec. 4, 1998, the contents of which is incorporated herein by reference.

With increase in the memory capacity of, for example, a DRAM, the memory cell array having a plurality of memory cells arranged therein is enlarged. As a result, the length of the word line for selecting the memory cell also becomes long. The long word line has a large time constant. Therefore, if the word line is driven from one point of the memory cell array, a long time is required for rising the word line to a predetermined potential. A divisional word line driving system in which the word lines are divided into a plurality of groups for the driving has been developed as a system for overcoming the above-noted difficulty.

Figure 10:
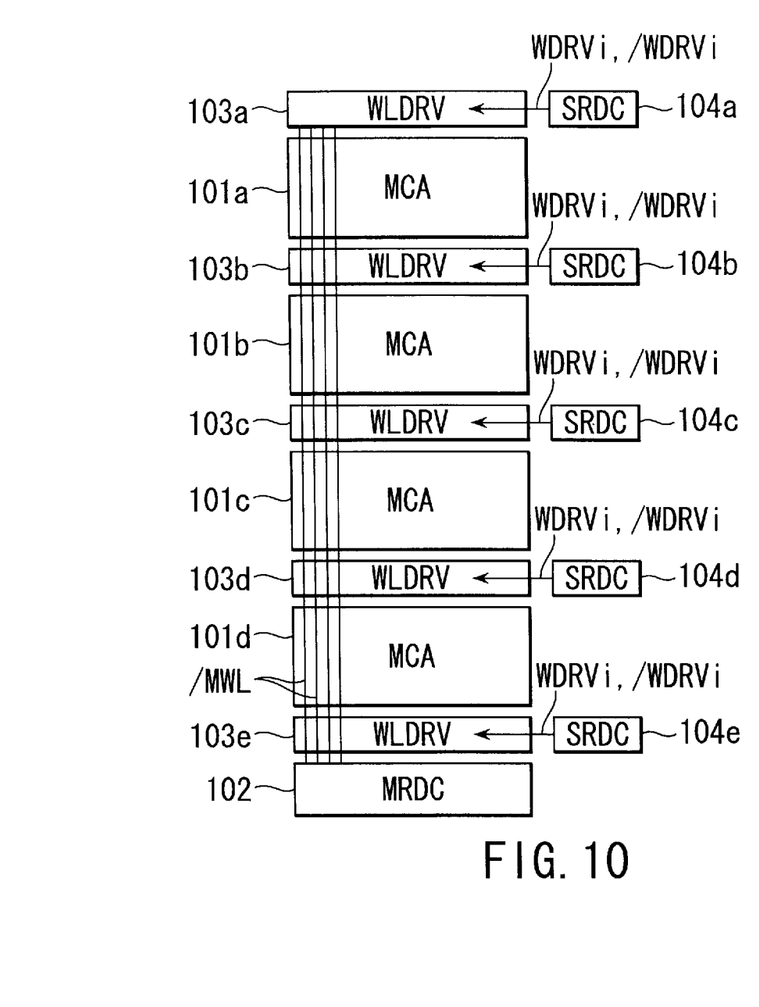
FIG. 10 shows the construction of a divisional word line driving system.

FIG. 10 shows a general divisional word line driving system applied to, for example, a DRAM of 256 bits. As shown in the drawing, memory cell arrays (MCA) 101a to 101d comprises a plurality of memory cells (not shown) as well as word lines and bit lines for selecting these memory cells. A plurality of main word lines /MWL ("/MWL" representing a wiring that is rendered active when the signal has a low level) are arranged on the memory cell arrays 101a to 101d. These main word lines /MWL are selected by main row decoder (MRDC) 102. Word line driving circuits (WLDRV) 103a to 103e for driving the word lines within the memory cell arrays are arranged on both sides in the direction of the word lines /MWL of the memory cell arrays 101a to 101d. Sub-row decoders (SRDC) 104a to 104e are connected to these word line driving circuits 103a to 103e, respectively. These sub-row decoders 104a to 104e selectively output a plurality of word line driving voltages WDRVi and /WDRVi, which are supplied to the word line driving circuits 103a to 103e.

In the divisional word line driving system of the construction described above, the word lines are made hierarchy into a plurality of main word lines /MWL and a plurality of word lines WL, and a single main word line /MWL is selected by the main row decoder 102. The word line drivers 103a to 103e serve to supply the word line driving signal WDRV, which is supplied from the sub-row decoders 104a to 104e, to one of the plural word lines connected to the selected single main word line /MWL.

Figure 11:
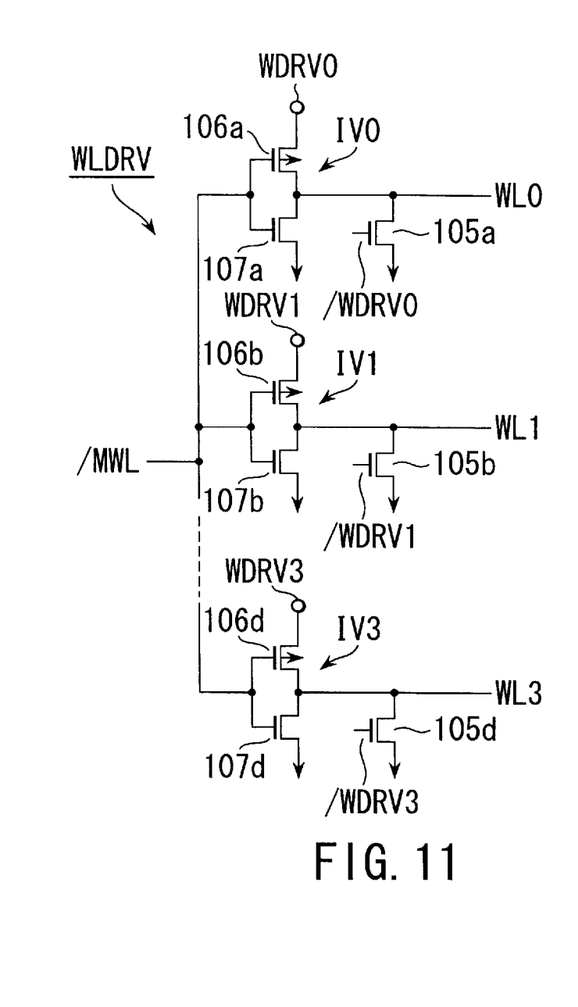
FIG. 11 is a circuit diagram exemplifying a word line driving circuit (WLDRV)

FIG. 11 exemplifies the word line driving circuit (WLDRV). The circuit shown in the drawing covers the case where, for example, four word line driving voltages WDRV0 to WDRV3 supplied from sub-row decoders are selectively outputted. The input terminals of inverter circuits IV0 to IV3 are connected to the main word lines/WML, with the output terminals connected to word lines WL0 to WL3. N-channel transistors 105a to 105d are connected to nodes between these word lines WL0 to WL3 and the ground. The word line driving voltages WDRV0 to WDRV3 are selectively supplied to the sources of P-channel transistors 106a to 106d constituting the inverter circuits, with the sources of N-channel transistors 107a to 107d connected to the ground. Further, inverted word line driving voltage /WDRV0 to /WDRV3 are selectively supplied to the gates of the transistors 105a to 105d.

In the circuit of the construction described above, a single main word line /MWL alone selected by the main row decoder among the plural main word lines /MWL is set to a low level, with the non-selected main word lines /MWL being set to a high level. In the inverter circuits of the word line driving circuit (WLDRV) connected to the non-selected main word line /MWL, the N-channel transistors 107a to 107d are turned on, and the output signal of each inverter circuit goes to a low level. As a result, the word lines connected to the output terminals of these inverter circuits are set to the ground level.

On the other hand, in each of the inverter circuits of the word line driving circuits (WLDRV) connected to the selected main word line /MWL, the P-channel transistors 106a to 106d are turned on. Since the row decoder causes one of the word line driving voltages WDRVi to be set to a high level, a single word line is driven by the inverter circuit supplied with the word line driving voltage WDRVi of the high level. In this step, since the word line driving voltage /WDRVi has a high level, any of the transistors 105a to 105d is turned on to cause the other word lines to be set to the ground level. For example, where the word line driving voltage WDRV0 has a high level, the word line WL0 is selected. Also, since the word line driving voltages /WDRV1 to /WDRV3 have a high level, the transistors 105b to 105d are turned on to cause the other word lines WL1 to WL3 to be set to the ground level.

As described above, the conventional word line driving circuit requires the word line driving voltage WDRV and /WDRV of the complementary level. Therefore, the circuit scale of the sub-row decoder is rendered large and the number of signal lines arranged for the word line driving circuit is increased, leading to the requirement of a large layout area.

The conventional word line driving circuit is also defective in that noise is generated when the word line is driven, as described in the following.

Figure 12:
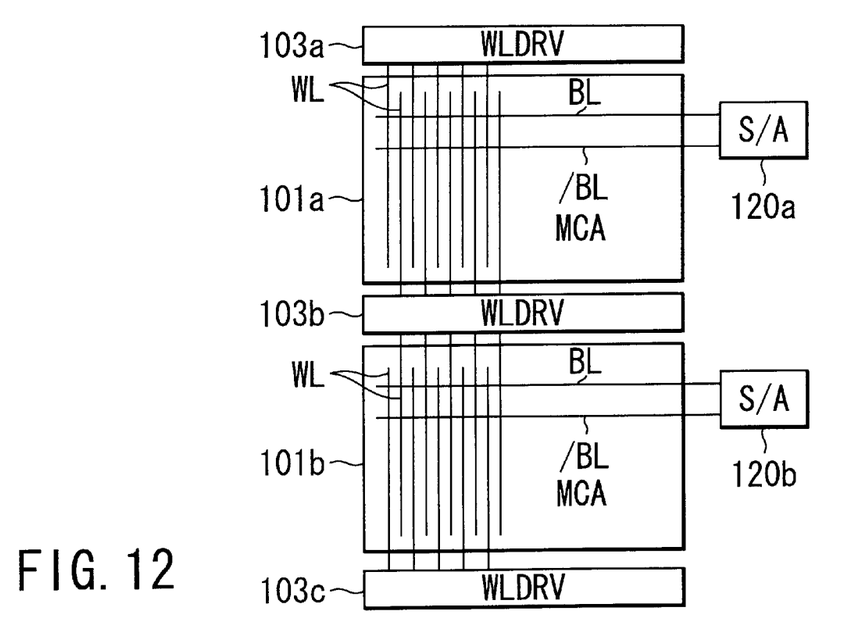
FIG. 12 shows the construction directed to the relationship between the word lines and the bit lines.

Specifically, FIG. 12 shows the relationship between the word lines and the bit lines. The reference numerals commonly used in FIGS. 10 and 12 denote the same members of the circuit. As shown in FIG. 12, a plurality of word lines WL arranged in the memory cell arrays 101a and 101b are alternately connected to the word line driving circuits 103a, 103b, 103c arranged on both sides of the memory cell arrays 101a, 101b so as to be driven by these word line driving circuits 103a, 103b, 103c. The particular arrangement permits sufficiently the layout pitch of the circuit elements constituting the word line driving circuits. Sense amplifiers (S/A) 120a, 120b for detecting the potential read on the bit lines are connected to a plurality of bit line pairs BL, /BL arranged to cross the word line WL.

When the signals generated from the memory cells are amplified by the sense amplifiers, the bit line pairs BL, /BL go to a high level or a low level. Thus, a potential difference between the bit line pairs BL and /BL increases. Also, it is unavoidable for a coupling capacitance to be present between the bit line BL and the word line WL. The coupling capacitance between the word line WL and the bit line pairs BL, /BL is larger in the case where the memory cell selected by the word line WL is connected to the bit line than in the case where the memory cell is not connected to the bit line.

A large number of bit line pairs are connected to a single word line. Therefore, where the word line selected by a single word line driving circuit is constructed to be selected in a deviant fashion toward the memory cells connected to one of the bit line, a big noise is generated in the sensing step in the word line driving circuit by the coupling between the bit line and the word line.

Figure 13:
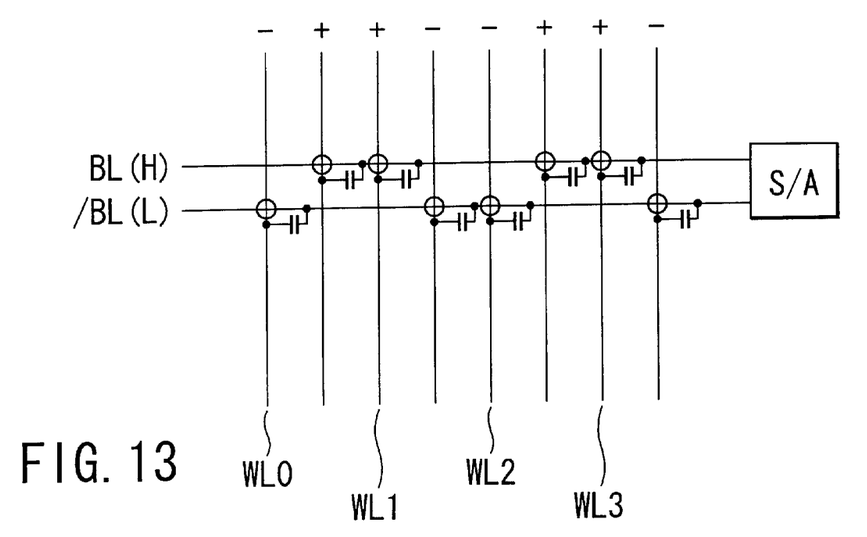
FIG. 13 shows the construction directed to the operation of the circuit shown in FIG. 12.

FIG. 13 shows the relationship between the memory cell connected to the bit line pair and the selected word line, covering the case where the word line is driven by the word line driving circuits positioned on both sides of the memory cell array. The memory cell is selected at the cross point between the word line marked ○ and the bit line BL. Also, the coupling capacitance between the word line WL and the bit line BL becomes the greatest at the points marked by the capacitor symbols in FIG. 13. If the bit line BL has a high level (H) and the bit line /BL has a low level (L) after the sense amplification by the sense amplifier as shown in FIG. 13, the direction of the noise applied to the word line is as denoted by symbols "+" and "−". Since the word lines WL0, WL1, WL2, WL3 are connected to the same word line driving circuit, the noise directions "+" and "−" of the word line driving circuit are balanced as a whole. It follows that a noticeable noise is not applied to the word line driving circuit regardless of the data in the memory to be sensed.

In the construction described above, a noticeable noise is not generated in the word line driving circuit. However, noise is generated in the individual word lines connected to the word line driving circuit. To be more specific, connected to each word line are N-channel transistors 107a to 107d constituting the inverter circuits IV0 to IV3, which are turned on and off by the signal of the main word line /MWL and the N-channel transistors 105a to 105d turned on and off by the word line driving voltage /WDRV0 to /WDRV3, as shown in FIG. 11. Therefore, noise is generated in the word line during operation of these transistors.

As described above, the conventional circuit construction necessitates the word line driving voltage WDRV for driving the word line and the word line driving voltage /WDRV having the complementary level. In addition, it is difficult to suppress sufficiently the noise of the individual word lines.

BRIEF SUMMARY OF THE INVENTION

The present invention, which has been achieved in an attempt to overcome the above-noted problems, is intended to provide a semiconductor memory device capable of driving the word line without using a word line driving voltage of the complementary level so as to decrease the layout area and also capable of suppressing the noise of the individual word lines, and to provide a method of manufacturing the particular semiconductor memory device.

According to a first aspect of the present invention, there is provided a semiconductor memory device, comprising: a plurality of word lines connected to memory cells; a first word line selecting circuit for generating a signal for selecting a group of word lines from the plural word lines; a second word line selecting circuit for supplying a driving voltage to a single word line included in the selected group of word lines in accordance with the signal supplied from the first word line selecting circuit; a first reset circuit connected to the group of word lines for short-circuiting the group of word lines when the signal supplied from the first word line selecting circuit is not selected; and a second reset circuit connected to each of the group of word lines and driven in accordance with the potential of the word line selected by the second word line selecting circuit so as to allow the non-selected word line to be set to a predetermined potential.

According to a second aspect of the present invention, there is provided a method of manufacturing a semiconductor memory device, comprising the steps of: forming a wiring groove within an insulating film; forming a resist film having an opening positioned above the insulating film and sized larger than a contact hole formed in the wiring groove; etching the insulating film using the resist film as a mask to form the contact hole communicating with the wiring groove in a region of logical multiplication between the wiring groove and the opening; depositing a conductive film on the entire surface to fill the wiring groove and the contact hole; and removing the conductive film positioned on the insulating film, thereby allowing the conductive film to remain within the wiring groove and the contact hole.

The semiconductor memory device of the present invention comprises a first reset circuit for resetting all the word lines selected by the main word line when the word lines are selected by the main word line, and a plurality of second reset circuits for resetting the non-selected word lines by using the potential of the selected word line when a single word line is selected by the main word line. Therefore, the word lines can be driven without requiring a word line driving voltage of the complementary level, making it possible to decrease the layout area and to suppress the noise of the individual word lines.

Further, a fine contact connected to a fine wiring can be manufactured easily in the present invention by employing a dual damascene technique.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

One embodiment of the present invention will now be described with reference to the accompanying drawings.

Figure 1:
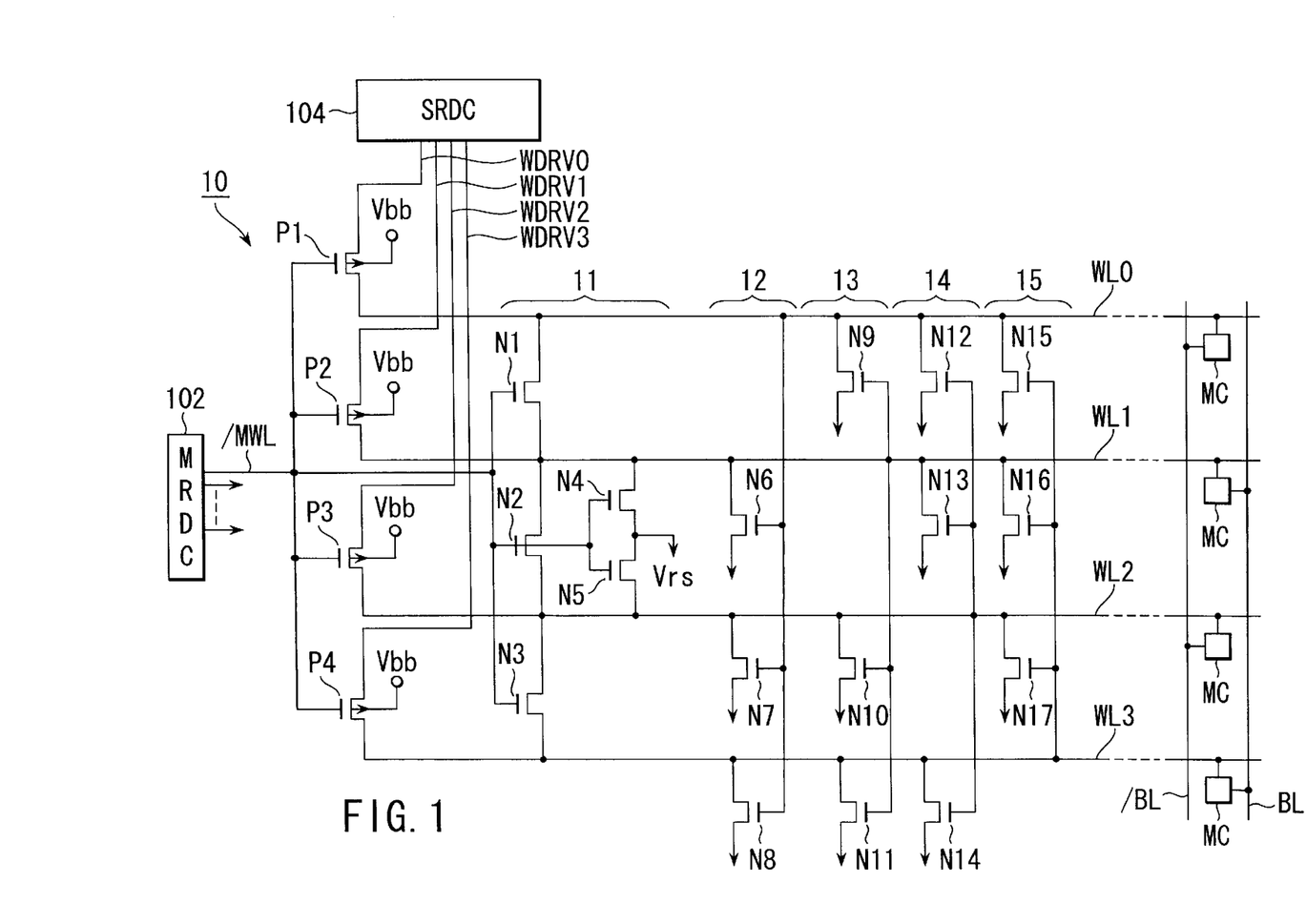
FIG. 1 is a circuit diagram exemplifying a word line driving circuit applied to a semiconductor memory device of the present invention.

Specifically, FIG. 1 shows a word line driving circuit 10 applied to a semiconductor memory device of the present invention. As shown in the drawing, the word line driving circuit 10 comprises a main row decoder (MRDC) 102, a sub-row decoder (SRDC) 104, and P-channel transistors P1, P2, P3, P4, etc. These P-channel transistors P1, P2, P3, P4 are connected to the main row decoder (MRDC) 102 and the sub-row decoder (SRDC) 104, and serve to drive a group of word lines, e.g., four word lines WL0, WL1, WL2, WL3, in response to a signal generated from the main row decoder 102 in accordance with the row address and supplied through the main word line /MWL and in response to the word line driving voltages WDRV0 to WDRV3 supplied from the sub-row decoder 104 in accordance with the row address. The word line driving voltages WDRV0 to WDRV3 are generated by boosting the power source voltage.

The main word line /MWL is connected to the gates of the P-channel transistors P1, P2, P3, P4. The word line driving voltages WDRV0 to WDRV3 generated from the sub-row decoder 104 are supplied to the sources of the transistors P1, P2, P3, P4. Further, a back gate bias Vbb, e.g., potential generated by boosting the power source voltage, is supplied to the substrate. The drains of these transistors P1, P2, P3, P4 are connected to the word lines WL0, WL1, WL2, WL3, respectively.

A first reset circuit 11 is arranged among the word lines WL0, WL1, WL2, WL3. When the word line driving circuit is not selected by the main word line /MWL, the first reset circuit 11 consisting of N-channel transistors N1, N2, N3, N4, N5 causes the word lines WL0, WL1, WL2 and WL3 to be short-circuited to set up a reset potential Vrs. To be more specific, the source and drains of the transistor N1 are connected to the word lines WL0 and WL1, respectively. The source and drains of the transistor N2 are connected to the word lines WL1 and WL2, respectively. The source and drains of the transistor N3 are connected to the word lines WL2 and WL3, respectively. Further, the transistors N4 and N5 are connected in series between the word lines WL1 and WL2. The gates of these transistors N1, N2, N3, N4 and N5 are connected to the main word line /MWL. Also, the node between the transistors N4 and N5 is set at the reset level Vrs, e.g., the ground potential.

Further, second to fifth reset circuits 12, 13, 14, 15 are arranged to the word lines WL0, WL1, WL2, WL3. When the word line driving circuit is selected by the main word line /MWL, these second to fifth reset circuits 12, 13, 14, 15 cause the non-selected word lines to be set to the reset level Vrs by using the potential of the selected word line.

When the word line WL0 is selected, the second reset circuit 12 serves to reset the other word lines. The second reset circuit 12 consists of N-channel transistors N6, N7, N8. The transistor N6 is connected between the word line WL1 and ground. The transistor N7 is connected between the word line WL2 and ground. Further, the transistor N8 is connected between the word line WL3 and ground. The gates of these transistors N6, N7, N8 are connected to the word line WL0.

When the word line WL1 is selected, the third reset circuit 13 serves to reset the other word lines. The third reset circuit 13 consists of N-channel transistors N9, N10, N11. The transistor N9 is connected between the word line WL0 and ground. The transistor N10 is connected between the word line WL2 and ground. Further, the transistor N11 is connected between the word line WL3 and ground. The gates of these transistors N9, N10, N11 are connected to the word line WL1.

When the word line WL2 is selected, the fourth reset circuit 14 serves to reset the other word lines. The fourth reset circuit 14 consists of N-channel transistors N12, N13, N14. The transistor N12 is connected between the word line WL0 and ground. The transistor N13 is connected between the word line WL1 and ground. Further, the transistor N14 is connected between the word line WL3 and ground. The gates of these transistors N12, N13, N14 are connected to the word line WL2.

When the word line WL3 is selected, the fifth reset circuit 15 serves to reset the other word lines. The fifth reset circuit 15 consists of N-channel transistors N15, N16, N17. The transistor N15 is connected between the word line WL0 and ground. The transistor N16 is connected between the word line WL1 and ground. Further, the transistor N17 is connected between the word line WL2 and ground. The gates of these transistors N15, N16, N17 are connected to the word line WL3.

Bit lines BL and /BL are arranged to cross the word lines WL0 to WL3 at right angles, and memory cells MC are connected to the intersections between the bit lines BL, /BL and the word lines WL0 to WL3.

The circuit of the construction described above is operated as follows. Specifically, where the word line driving circuit 10 is not selected by the main word line /MWL, the main word line /MWL has a high level. As a result, the P-channel transistors P1 to P4 of the word line driving circuit 10 are turned off, and the N-channel transistors N1 to N5 constituting the first reset circuit 11 are turned on. It follows that the word lines WL0 to WL3 are short-circuited via the transistors N1 to N3. Further, the word line WL0 to WL3 are allowed to be set to the reset potential Vrs via the transistors N4, N5.

On the other hand, where the word line driving circuit 10 is selected by the main word line /MWL, the main word line /MWL has a low level. As a result, the P-channel transistors P1 to P4 of the word line driving circuit 10 are turned on. In this step, where the word line driving voltage WDRV0 is generated from, for example, the row decoder 104 in accordance with the row address, the voltage is supplied to the word line WL0 through the transistor P1 so as to activate the word line WL0. In accordance with activation of the word line WL0, the second reset circuit 12 is activated so as to turn the transistors N6 to N8 on. It follows that the word lines WL1 to WL3 are connected to ground through these transistors N6 to N8.

Also, where the word line driving voltage WDRV1 is generated from the sub-decoder 104, the voltage is supplied to the word line WL1 through the transistor P2 so as to activate the word line WL1. In accordance with activation of the word line WL1, the third reset circuit 13 is activated so as to turn the transistors N9 to N11 on. It follows that the word lines WL0, WL2, WL3 are connected to ground through these transistors N9 to N11.

Similarly, where the word line driving voltage WDRV2 is generated from the sub-decoder 104, the word line WL2 is activated. In accordance with activation of the word line WL2, the fourth reset circuit 14 is activated. It follows that the word lines WL0, WL1, WL3 are connected to ground through the transistors N12, N13 and N14.

Further, where the word line driving voltage WDRV3 is generated from the sub-decoder 104, the word line WL3 is activated. In accordance with activation of the word line WL3, the fifth reset circuit 15 is activated. It follows that the word lines WL0, WL1, WL2 are connected to the ground through the transistors N15, N16 and N17.

In the embodiment described above, the word line driving circuit 10 comprises the second to fifth reset circuits 12 to 15. Where a single word line is activated, the corresponding one of the second to fifth reset circuits 12 to 15 is activated by the potential of the activated word line so as to connect the word lines that are not activated to the ground. It follows that the word lines that are not activated can be reset without using the complementary voltage /WDRV0 to /WDRV3 of the word line driving voltages WDRV0 to WDRV3 used in the conventional device.

In the embodiment described above, a plurality of transistors are required for forming the second to fifth reset circuits 12 to 15. However, the layout area of these transistors is smaller than the area required for arranging four wirings for transmitting the word line voltages /WDRV0 to /WDRV3. It follows that the present invention permits diminishing the total layout area.

It should also be noted that the word line driving circuit 10 comprises the first reset circuit 11 for allowing a plurality of word lines to be short-circuited. Where the word line driving circuit 10 is not selected, the first reset circuit 11 is driven by a signal generated from the main word line /MWL so as to permit each word line to be short-circuited. Where the N-channel transistors constituting an inverter circuit connected to each word line are turned on by a signal generated from the main word line /MWL so as to individually connect each word line to the ground as in the prior art, noise is generated when each of the N-channel transistors is activated. The noise thus generated renders the potential of the word line unstable. On the other hand, where each word line is short-circuited by the first reset circuit 11 as in the embodiment of the present invention described above, the noise of each word line is directly canceled via the transistors N1 to N5. It follows that noise is not generated from the word line driving circuit 10 so as to maintain stable the potential of the non-selected word line.

FIGS. 2 to 8 exemplify the layout of the word line driving circuit according to the present invention. The reference numerals commonly used in FIG. 1 and FIGS. 2 to 8 denote the same members of the circuit.

Figure 2:
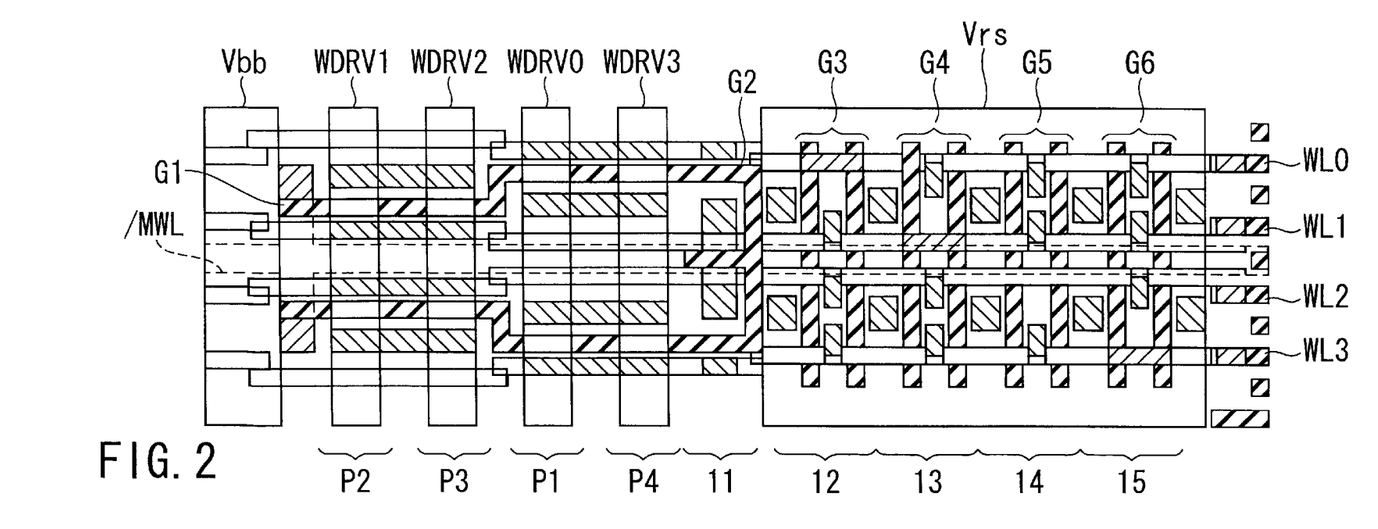
FIG. 2 is a plan view exemplifying the layout of the word line driving circuit shown in FIG. 1.

FIG. 2 shows that all the layers are superposed one upon the other. The P-channel transistors P1 to P4 are formed in N-type well regions (not shown) of the semiconductor substrate, and the first to fifth reset circuits 11 to 15 consisting of N-channel transistors are formed in P-well regions (not shown) within the semiconductor substrate. The main word line /MWL denoted by broken lines are positioned above the regions for forming the P-channel transistors and the regions for forming the N-channel transistors.

In order to increase the width of a channel region of each P-channel transistor, each gate G1 is made parallel to the word line. Also, gates G2, G3, G4, G5, G6 of the N-channel transistors extend in a direction perpendicular to the word line. The particular construction permits the source of each transistor to be connected to the ground via the shortest distance.

Figure 3:
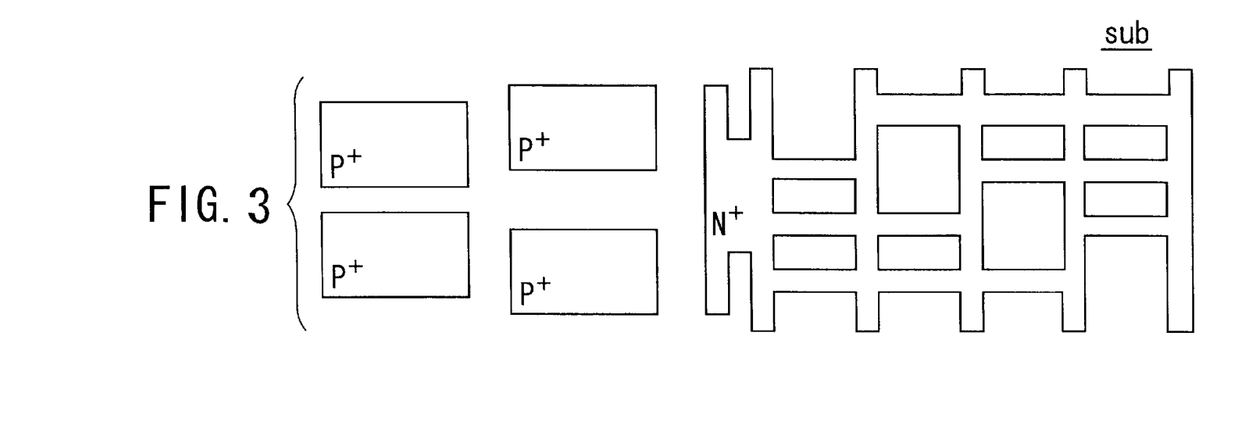
FIG. 3 is a plan view showing the layout of a part of FIG. 2.

FIG. 3 shows the layout of the diffusion layer shown in FIG. 2. As shown in the drawing, $P^+$ diffusion layers are arranged in the region of a semiconductor substrate sub for forming the P-channel transistors, and an $N^+$ diffusion layer is continuously formed in the region for forming the N-channel transistors.

Figure 4:
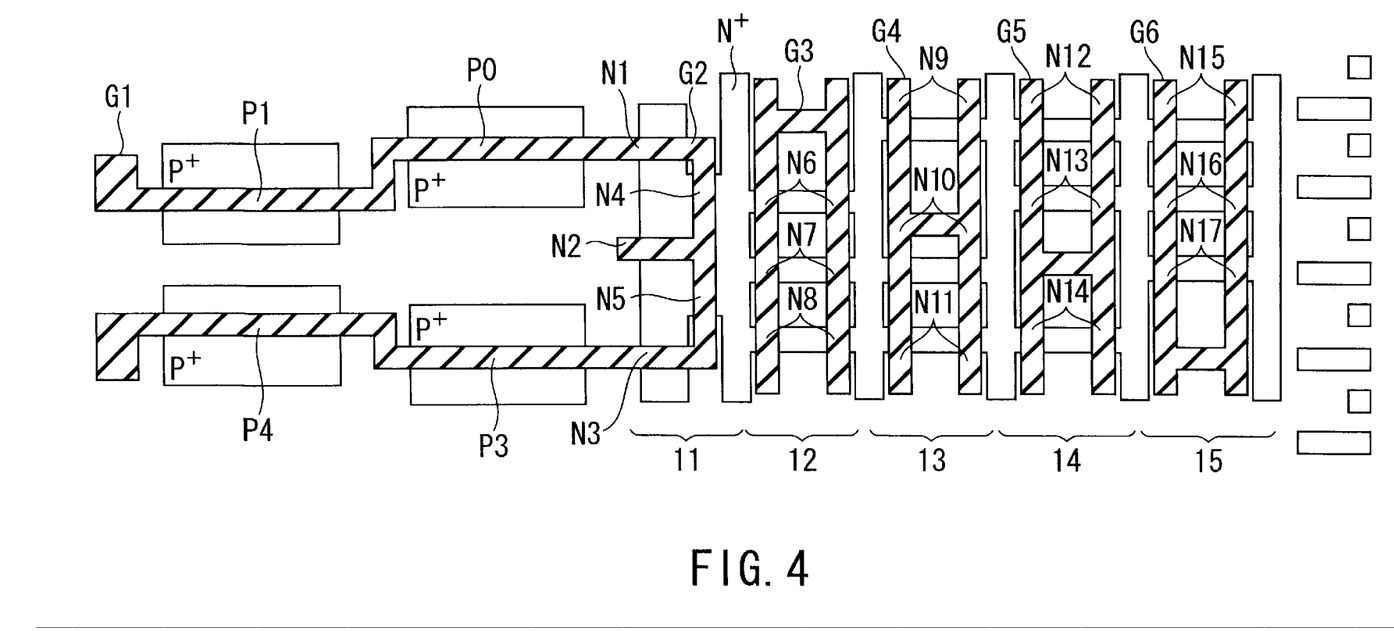
FIG. 4 is a plan view showing the layout of a part of FIG. 2.

FIG. 4 covers the case where gates G1 to G6 of transistors are arranged in the layout of the $P^+$ diffusion layers and the $N^+$ diffusion layer shown in FIG. 3. A P-channel transistor and N-channel transistors are formed in the regions where the diffusion layers overlap with the gates G1 to G6.

Figure 5:
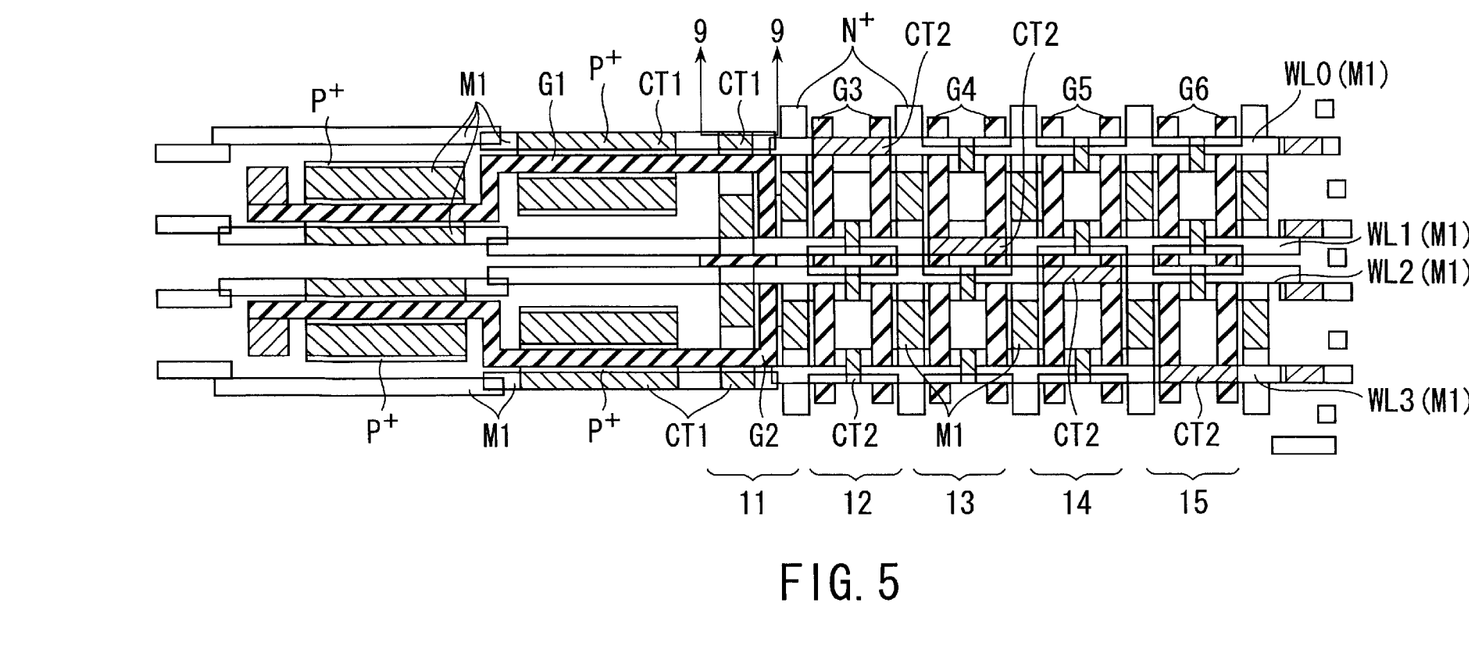
FIG. 5 is a plan view showing the layout of a part of FIG. 2.

FIG. 5 shows first metal wiring layers M1 constituting the lowermost layers of the word lines WL0 to WL3 and a plurality of contacts formed in the layout shown in FIG. 4. A contact CT1 serves to connect the first metal wiring layer M1 to the $P^+$ diffusion layer and to the $N^+$ diffusion layers. On the other hand, a contact CT2 serves to connect the first metal wiring layer M1 to the gates G2 to G6.

The contact CT1 serving to connect the first metal wiring layer M1 to the $P^+$ diffusion layer and to the $N^+$ diffusion layers and the contact CT2 serving to connect the first metal wiring layer M1 to the gates G2 to G6 can be formed by employing the dual-damascene technique without forming a fine contact pattern with a resist. This will be described hereinlater.

Figure 6:
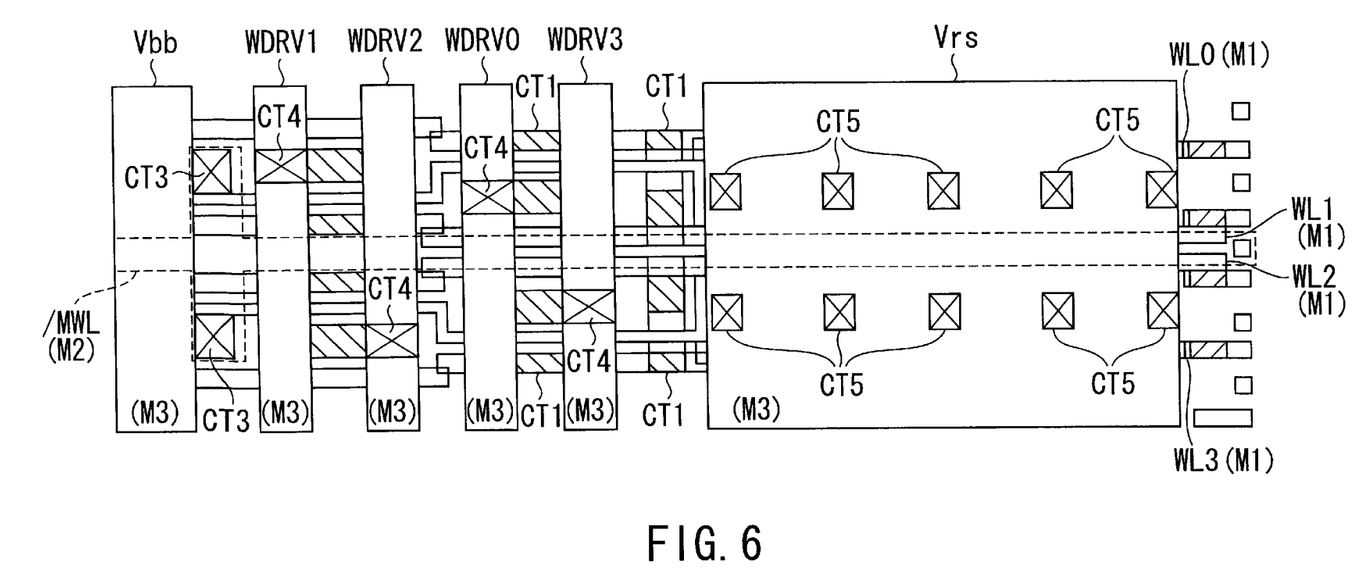
FIG. 6 is a plan view showing that second and third metal wiring layers are formed in the layout shown in FIG. 2.

FIG. 6 shows the layout including second and third metal wiring layer M2 and M3. The main word line /MWL denoted by a broken line is constituted by the second metal wiring layer M2. On the other hand, the wiring to which is supplied the word line driving voltage WDRV0 to WDRV3, the wiring to which is supplied the back gate bias Vbb of the P-channel transistor, and the wiring through which the reset potential Vrs is supplied to the N-channel transistor are constituted by the third metal wiring layer M3. A plurality of contacts CT3 serve to connect the second metal wiring layer M2 constituting the main word line /MWL (M2) to the first metal wiring layer M1 formed in the gate G1. A plurality of contacts CT4 serve to connect the third metal wiring layer M3 to which is supplied the word line driving voltage WDRV0 to WDRV3 to the first metal wiring layer M1 formed on the diffusion layer of the P-channel transistor. Further, a plurality of contacts CT5 serve to connect the third metal wiring layer M3 to which is supplied the reset voltage Vrs to the first metal wiring layer M1 formed on the diffusion layer of the N-channel transistor.

The dual-damascene method is a technique for forming, for example, a metal wiring and a contact simultaneously. To be more specific, a wiring trench is formed in a predetermined portion of an insulating film and, at the same time, a contact hole communicating with the wiring trench is formed in a predetermined portion of the wiring trench. Then, the wiring trench and the contact hole are filled with a metal, followed by applying a CMP (Chemical Mechanical Polishing) method to remove the extra metal on the insulating film except the wiring trench and the contact hole. For forming the wiring trench and the contact hole, the wiring trench is formed first, followed by forming the contact hole in a bottom portion of the wiring trench. The position of the contact hole can be determined by self-alignment as a region overlapping with the opening of the resist pattern used for forming the contact hole.

Figure 7A:
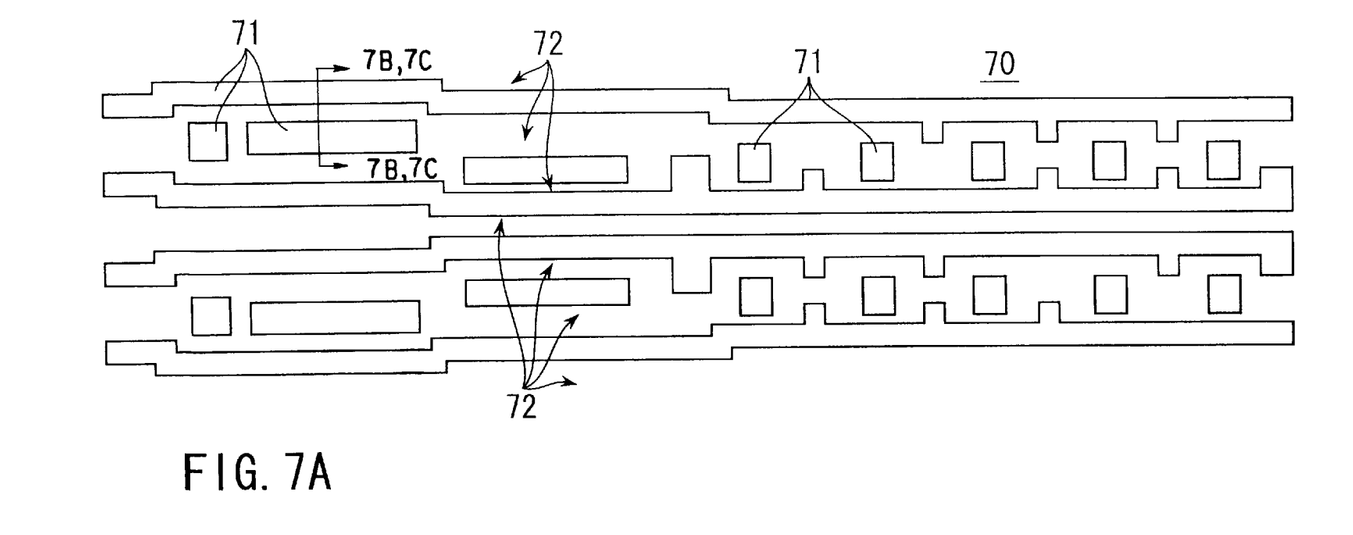
FIG. 7A is a plan view showing the layout of a wiring trench in which is formed a first metal wiring layer shown in FIG. 2.
Figure 7B:
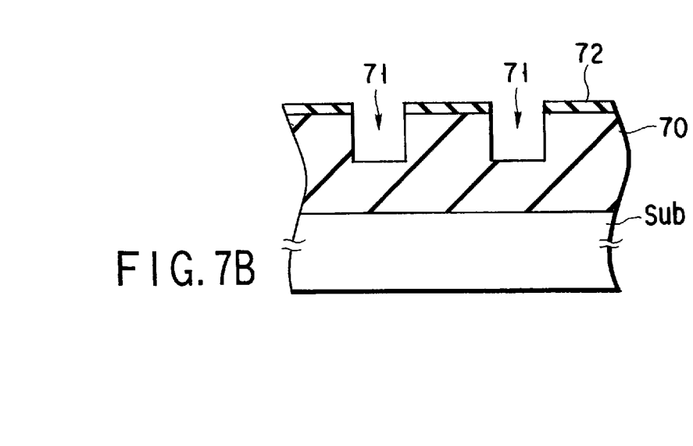
FIGS. 7B and 7C are cross sectional views along lines 7B—7B and 7C—7C, respectively, shown in FIG. 7A.

FIGS. 7A to 9 collectively show a method of forming contact holes by the dual-damascene method. Specifically, FIGS. 7A and 7B show the layout of a plurality of wiring trenches 71 formed in an insulating film 70. The insulating film 70 is formed over the P-channel transistor and the N-channel transistor. These wiring trenches 71 are formed to correspond to the first metal wiring layer M1.

Figure 8A:
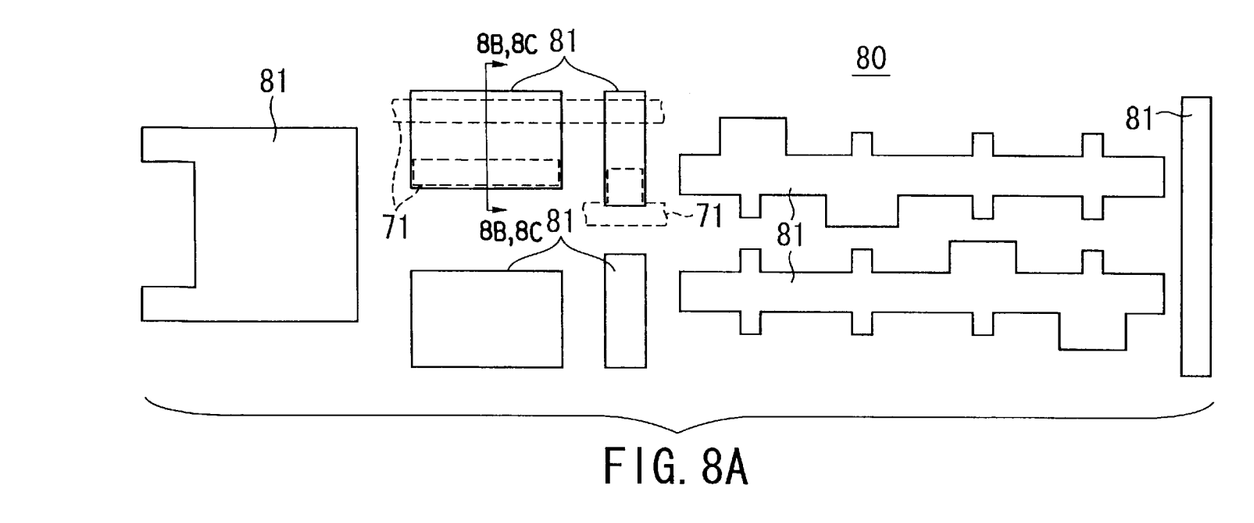
FIG. 8A is a plan view showing a resist pattern for forming a contact.
Figure 8B:
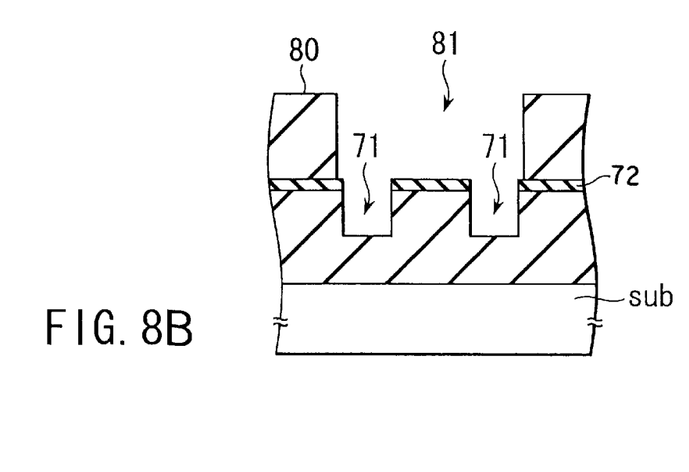
FIGS. 8B and 8C are cross sectional views along lines 8B—8B and 8C—8C, respectively, shown in FIG. 8A.

FIGS. 8A and 8B collectively show the resist pattern for forming contacts. Specifically, a plurality of openings 81 are formed in those portions of a resist film 80 at which contact holes are to be formed. The size of the opening 81 in the width direction of the wiring trench 71 is greater than the size of the contact hole formed later. In forming the contact hole, the resist pattern shown in FIG. 8A is formed on the layout of the wiring trench 71 shown in FIG. 7A, and the insulating film 70 is etched by, for example, RIE (Reactive Ion Etching) using the resist pattern as a mask. The region other than the wiring trench 71 shown in FIG. 7A is covered with an etching resistant film 72 exhibiting an etching rate lower than that of the insulating film. For example, an amorphous silicon film or a titanium nitride film is used as the etching resistant film 72. As a result, contact holes are formed in only the regions of the logical multiplication between FIGS. 7A and 8A, i.e., the regions that are not covered with the etching resistant film 72 and with the resist film 70. These regions coincide with the contacts CT1 and CT2 shown in FIG. 5. Then, the resist film 80 is removed, followed by depositing a metal on the entire surface of the insulating film 70 so as to fill the wiring trench and the contact hole. After the metal deposition, the metal on the insulating film 70 is removed by the CMP method. The etching resistant film 72 is formed on the surface of the insulating film 70 before formation of, for example, the wiring trench 71, and the wiring trench 71 is formed by successively etching the etching resistant film 72 and the insulating film 70. Alternatively, the etching resistant film 72 is formed on the entire surface of the insulating film 70 after formation of, for example, the wiring trench 71, followed by selectively removing the etching resistant film 72 positioned within the wiring trench.

Figure 7C:
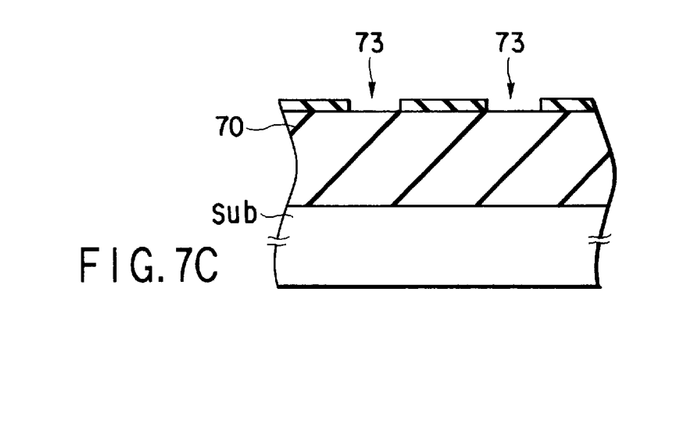
Figure 8C:
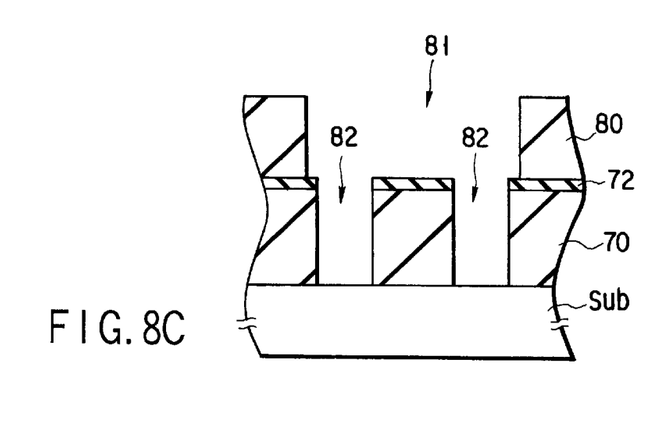

The methods of forming the wiring trench and the contact are not limited to those described above. For example, it is possible to form contacts first, followed by forming the wiring trench, as shown in, for example, FIGS. 7C and 8C. To be more specific, the etching resistant film 72 is formed first on the insulating film 70, as shown in FIG. 7C. Then, the film 72 is etched by, for example, RIE to form a pattern 73 corresponding to the wiring trenches 71 shown in FIG. 7A, followed by forming the resist film 80 on the entire surface. Further, the resist film 80 is patterned to form a resist pattern having a plurality of openings 81 conforming with the positions at which contact holes are to be formed, as shown in FIGS. 8A and 8C. The size of the opening 81 in the width direction of the wiring trench 71 is set larger than the size of the contact hole that is to be formed later. Then, the insulating film 70 is etched by, for example, RIE using the resist pattern and the etching resistant film 72 as a mask to form contact holes 82, followed by removing the resist film 80. Further, the insulating film 70 is etched by, for example, RIE using the etching resistant film 72 as a mask to form the wiring trench 71 communicating with and shallower than the contact hole 82. Finally, the contact holes 82 and the wiring trench 71 are filled with a metal by the process described previously.

Figure 9:
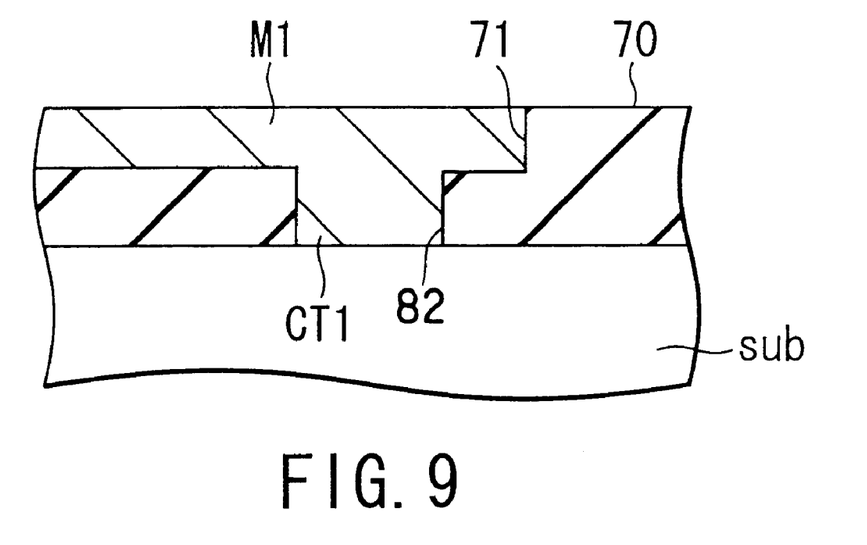
FIG. 9 is a cross sectional view along the line 9—9 shown in FIG. 5.

FIG. 9, which is a cross sectional view along the line 9—9 shown in FIG. 5, shows the contact CT1. As shown in the drawing, a contact hole 82 is formed at a bottom portion of the wiring trench 71. The first metal wiring layer M1 is integrally formed to fill the wiring trench 71 and the contact hole 82.

As described above, the dual-damascene method makes it unnecessary to form with resist a pattern having contact holes of the actual size in forming the contact hole, and makes it possible to form contact holes by using a resist pattern having openings greater than the actual contact holes. It follows that the aligning allowance of a fine resist pattern can be moderated so as to facilitate the manufacture of the semiconductor device.

In general, the size of the contact hole is the smallest design size used in the manufacture of a semiconductor integrated circuit. Also, since the semiconductor integrated circuit is made finer and finer, it is very difficult to form in a resist an opening equal in size to the contact hole. Particularly, the wiring density is high in the word line driving circuit in the vicinity of the memory core described above and in the region of the sense amplifier, etc. connected to the bit line, making it very difficult to form fine contacts. Naturally, the method of forming contacts by employing the dual-damascene technique is highly effective for forming the contacts in these regions.

In the embodiment described above, each of the transistors constituting the second to fifth reset circuits 12 to 15 is connected between each word line and ground. Alternatively, these transistors can be constructed to permit the non-selected word lines to be short-circuited, like the first reset circuit 11.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
   a plurality of word lines connected to memory cells;
   a first word line selecting circuit for generating a signal for selecting a group of word lines from the plural word lines;
   a second word line selecting circuit for supplying a driving voltage to a single word line included in the selected group of word lines in accordance with the signal supplied from said first word line selecting circuit;
   a first reset circuit connected to the group of word lines for short-circuiting each word line of the group of word lines when the signal is not generated by the first word line selecting circuit; and
   a second reset circuit connected to each word line in the group of word lines, said second reset circuit driven in accordance with the potential of the word line selected by the second word line selecting circuit, and configured to set non-selected word line to a predetermined potential.

2. The semiconductor memory device according to claim 1, wherein said second word line selecting circuit has a plurality of first transistors of a first conductivity type, the gate of each of said first transistors being connected to said first word line selecting circuit, said driving voltage being supplied to source of each of the first transistors, and drain of each of the first transistors being connected to the word line.

3. The semiconductor memory device according to claim 2, wherein said first reset circuit has a plurality of second transistors of a second conductivity type, a current path of each of said second transistors is connected between word lines, and a signal generated from said first word line selecting circuit is supplied to a gate of each of the second transistors.

4. The semiconductor memory device according to claim 3, further comprising a plurality of third transistors of the second conductivity type having current paths connected in series between a pair of word lines among said group of word lines, a signal generated from the first word line selecting circuit being supplied to a gate of each of said third transistors, and a predetermined reset potential being supplied to an intermediate portion of each of said current paths.

5. The semiconductor memory device according to claim 4, wherein said second reset circuit has n−1 number of fourth transistors of the second conductivity type in the case where said group of word lines consists of n-number of word lines, drains of said fourth transistors being connected respectively to n−1 number of word lines, sources of said fourth transistors being allowed to be set to said predetermined potential, and gates of said fourth transistors of the second conductivity type being connected to the remaining single word line.

6. The semiconductor memory device according to claim 5, further comprising a plurality of contacts serving to connect the word lines to the first to fourth transistors and formed integral with the word lines.

7. The semiconductor memory device according to claim 6, wherein said contacts and word lines have a dual-damascene structure.

8. The semiconductor memory device according to claim 7, wherein said word lines and contacts are integrally formed by a first metal layer.

9. The semiconductor memory device according claim 6, wherein openings formed in a resist film for forming said contacts are sized larger than the contacts, and contact holes are arranged in regions of logical multiplication between wiring trenches for forming the word lines and said openings.

10. The semiconductor memory device according to claim 6, wherein the gates of said first transistors are arranged along the word line and the gates of the second to fourth transistors are arranged in a direction perpendicular to the word line.

11. A semiconductor memory device, comprising:

a plurality of word lines connected to memory cells;

a first word line selecting circuit for generating a signal for selecting a group of word lines from the plural word lines;

a plurality of first transistors of a first conductivity type having a first end of a current path connected to each word line included in the group of word lines, the signal generated from said first word line selecting circuit being supplied to a gate of each of said first transistors;

a second word line selecting circuit connected to a second end of the current path of said first transistors for forming a driving voltage for driving one word line included in the selected group of word lines, the driving voltage being supplied to the second end of the current path of each of said first transistors;

a first reset circuit connected to said group of word lines for short-circuiting each word line of the group of word lines when the signal is not supplied from the first word line selecting circuit; and a second reset circuit connected to each word line in the group of word lines, said second reset circuit driven in accordance with the potential of the word line selected by the second word line selecting circuit, and configured to set non-selected word lines to a predetermined potential.

12. The semiconductor memory device according to claim 11, wherein said first reset circuit has a plurality of second transistors of a second conductivity type, the current path of each of said second transistors is connected between word lines, and a signal generated from the first word selecting circuit being supplied to the gate of each of the second transistors.

13. The semiconductor memory device according to claim 12, further comprising a plurality of third transistors of the second conductivity type having current paths connected in series between a pair of word lines, a signal generated from the first word line selecting circuit being supplied to a gate of each of the third transistors, and a predetermined preset potential being supplied to an intermediate portion of the current path.

14. The semiconductor memory device according to claim 13, wherein said second reset circuit consists of n−1 number of fourth transistors of the second conductivity type in the case where said group of word lines consists of n-number of word lines, drains of said fourth transistors being connected respectively to n−1 number of word lines, sources of said fourth transistors being allowed to be set to said predetermined potential, and gates of said fourth transistors of the second conductivity type being connected to the remaining single word line.

15. The semiconductor memory device according to claim 14, further comprising a plurality of contacts serving to connect the word lines to the first to fourth transistors and formed integral with the word lines.

16. The semiconductor memory device according to claim 15, wherein contacts and word lines form a dual-damascene structure.

17. The semiconductor memory device according to claim 16, wherein word lines and contacts are integrally formed by a first metal layer.

18. The semiconductor memory device according to claim 17, wherein openings formed in a resist film for forming said contacts are sized larger than the contacts, and contact holes are arranged in regions of logical multiplication between wiring trenches for forming the word lines and said openings.

19. The semiconductor memory device according to claim 15, wherein the gates of the first transistors are arranged along the word lines, and the gates of the second to fourth transistors are arranged in a direction perpendicular to the word line.

20. A method of manufacturing a semiconductor memory device, comprising the steps of:

forming a wiring trench within an insulating film, an etching resistant first film being formed on that portion of said insulating film which is positioned around the wiring trench;

forming a resist film having an opening on said first film, said opening being sized larger than a contact hole formed in said wiring trench;

etching said insulating film with said resist film and said first film as a mask to form said contact hole communicating with the wiring trench, said contact hole being formed in a region of logical multiplication between said wiring trench and said opening;

depositing a conductive film on the entire surface to fill the wiring trench and the contact hole with said conductive film; and removing that portion of the conductive film which is positioned on the insulating film to allow the conductive film to remain within the wiring trench and the contact hole.

21. The method of manufacturing a semiconductor memory device according to claim 20, wherein said wiring trench includes a word line, and said contact hole is formed in a part of said word line.

22. The method of manufacturing a semiconductor memory device according to claim 20, wherein said wiring trench includes a bit line, and said contact hole is formed in a part of said bit line.

23. A method of manufacturing a semiconductor memory device, comprising the steps of:

forming a first film on an insulating film, said first film being lower in its etching rate than said insulating film;

etching said first film to form a pattern conforming with a wiring trench;

forming a resist film having an opening on the first film, said opening being sized larger than the width of said pattern;

etching said insulating film with the first film and the resist film used as a mask to form a contact hole, said contact hole being formed in a region of the logical multiplication between the pattern of the first film and the opening of the resist film;

removing said resist film;

etching the insulating film with the pattern of the first film used as a mask to form said wiring trench communicating with said contact hole, the depth of said wiring trench being smaller than that of said contact hole;

depositing a conductive film on the entire surface to allow said conductive film to fill the wiring trench and the contact hole; and removing that portion of the conductive film which is positioned on the insulating film to allow the conductive film to remain within the wiring trench and the contact hole.

24. The method of manufacturing a semiconductor memory device according to claim 23, wherein said wiring trench includes a word line, and said contact hole is formed in a part of said word line.

25. The method of manufacturing a semiconductor memory device according to claim 23, wherein said wiring trench includes a bit line, and said contact hole is formed in a part of said bit line.

* * * * *